(12) United States Patent
Tomita et al.

(10) Patent No.: US 11,978,572 B2
(45) Date of Patent: May 7, 2024

(54) SUPERCONDUCTIVE CABLE

(71) Applicant: RAILWAY TECHNICAL RESEARCH INSTITUTE, Kokubunji (JP)

(72) Inventors: Masaru Tomita, Kokubunji (JP); Atsushi Ishihara, Kokubunji (JP)

(73) Assignee: RAILWAY TECHNICAL RESEARCH INSTITUTE, Kokubunji (JP)

( * ) Notice: Subject to any disclaimer, the term of this patent is extended or adjusted under 35 U.S.C. 154(b) by 904 days.

(21) Appl. No.: 16/981,481

(22) PCT Filed: Jan. 28, 2019

(86) PCT No.: PCT/JP2019/002663
§ 371 (c)(1),
(2) Date: Sep. 16, 2020

(87) PCT Pub. No.: WO2019/181200
PCT Pub. Date: Sep. 26, 2019

(65) Prior Publication Data
US 2021/0005356 A1    Jan. 7, 2021

(30) Foreign Application Priority Data

Mar. 19, 2018   (JP) .................................. 2018-050488

(51) Int. Cl.
*H01B 12/16* (2006.01)
*H01B 12/02* (2006.01)
*H01B 12/14* (2006.01)

(52) U.S. Cl.
CPC ............. *H01B 12/16* (2013.01); *H01B 12/02* (2013.01); *H01B 12/14* (2013.01)

(58) Field of Classification Search
CPC ................................ H01B 12/14; H01B 12/02
See application file for complete search history.

(56) References Cited

U.S. PATENT DOCUMENTS

| 5,964,990 A * | 10/1999 | Muratori ................... C25F 7/00 204/278 |
| 2005/0173149 A1* | 8/2005 | Gouge ................... H02G 15/34 174/125.1 |

(Continued)

FOREIGN PATENT DOCUMENTS

| CN | 106971788 A | 7/2017 |
| JP | 2006-059695 A | 3/2006 |

(Continued)

OTHER PUBLICATIONS

International Search Report dated Apr. 2, 2019, issued in counterpart International Application No. PCT/JP2019/002663. (1 page).

(Continued)

*Primary Examiner* — Paul A Wartalowicz
(74) *Attorney, Agent, or Firm* — WHDA, LLP

(57) ABSTRACT

A superconducting cable (1) includes a superconducting cable core (2) and a corrugated pipe (21) storing the superconducting cable core (2). The superconducting cable core (2) has a corrugated pipe (11), a superconductor (12) provided on the outer peripheral side of the corrugated pipe (11), and a heat insulating pipe (23) stored in the corrugated pipe (11) and having a smooth inner peripheral surface. A coolant flows through a flow passage (FP1) formed in the heat insulating pipe (23) and then flows through a flow passage (FP2) formed between an outer peripheral surface of the corrugated pipe (11) and an inner peripheral surface of the corrugated pipe (21).

15 Claims, 6 Drawing Sheets

(56) References Cited

U.S. PATENT DOCUMENTS

| | | | |
|---|---|---|---|
| 2008/0194411 A1* | 8/2008 | Folts | H10N 60/203 |
| | | | 505/110 |
| 2008/0293575 A1* | 11/2008 | Hirose | H01B 12/16 |
| | | | 505/430 |
| 2013/0032395 A1* | 2/2013 | Smoll | H01R 43/005 |
| | | | 29/874 |
| 2013/0199821 A1* | 8/2013 | Teng | H01B 12/02 |
| | | | 174/125.1 |
| 2014/0378312 A1 | 12/2014 | Tamada et al. | |
| 2016/0053596 A1* | 2/2016 | Rey | E21B 43/26 |
| | | | 166/302 |
| 2016/0141081 A1 | 5/2016 | Carter et al. | |

FOREIGN PATENT DOCUMENTS

| | | |
|---|---|---|
| JP | 2013-125647 A | 6/2013 |
| JP | 2016-110988 A | 6/2016 |
| JP | 2019-36441 A | 3/2019 |
| WO | 2013/089219 A1 | 6/2013 |

OTHER PUBLICATIONS

Written Opinion of the International Searching Authority (Form PCT/ISA/237) dated Apr. 2, 2019, issued in counterpart International Application No. PCT/JP2019/002663. (4 pages).

Extended (supplementary) European Search Report dated Nov. 10, 2021, issued in counterpart EP Application No. 19772198.8. (8 pages).

\* cited by examiner

SUPERCONDUCTIVE CABLE

TECHNICAL FIELD

The present invention relates to a superconducting cable.

BACKGROUND ART

A superconducting cable uses a superconductor as a conductor through which a current flows. Since the superconducting cable can flow a large current even if it has a small cross-sectional area, the superconducting cable attracts attention from the viewpoint of downsizing equipment related to power transmission or improving power transmission efficiency.

On the other hand, when a current flows through the superconducting cable, it is necessary to constantly cool the superconductor so as to maintain a superconducting state. Specifically, for example, it is necessary to maintain the superconducting state by circulating the cooled coolant in such a procedure that the coolant for cooling the superconductor is cooled by a cooling device, the cooled coolant is flown into the superconducting cable using a pump, the superconductor is cooled by the coolant flowing through the superconducting cable, and the coolant after cooling the superconductor is returned to the cooling device and cooled again.

In a case where the superconducting cable is used as a power transmission line for transmitting AC power, it is enough to provide power leads, which are connection parts for flowing the current from the outside to the superconducting cable, at two places on both ends of the superconducting cable. Further, in a case where the superconducting cable is used as the power transmission line, two or more power transmission lines are normally laid. Therefore, one line can be provided with an outgoing passage through which an outgoing coolant flows and other line can be provided with a returning passage through which a returning coolant flows.

Unlike the case where the superconducting cable is used as the power transmission line for transmitting the AC power, in a case where the superconducting cable is used as a feeder line for an electric railway, a plurality of power leads that are respectively connected to a plurality of parts of the superconductor disposed at intervals from each other and supply power to a trolley wire may be provided. Further, in the case where the superconducting cable is used as the feeder line, only one feeder line is normally laid. For this reason, unlike the case where the superconducting cable is used as the power transmission line, it is difficult to provide an outgoing passage through which an outgoing coolant flows in one line and provide a returning passage through which a returning coolant flows in other line. Therefore, there is a case where the superconducting cable used as the feeder line includes a double pipe of an inner pipe and an outer pipe, a flow passage as an outgoing passage through which an outgoing coolant flows is provided in the inner pipe, and a flow passage as a returning passage through which a returning coolant flows is provided between the inner pipe and the outer pipe.

JP 2013-125647 A (Patent Literature 1) discloses technology of a superconducting cable which has a superconductor, two or more coolant passages including an outgoing coolant passage and a returning coolant passage for flowing a coolant for cooling the superconductor, and an insulating pipe having the superconductor and the coolant passages formed therein and in which, for the coolant passages, by a double pipe of an inner pipe and an outer pipe, the outgoing coolant passage is formed in an internal space of the inner pipe and the returning coolant passage is formed in a space between the inner pipe and the outer pipe.

CITATION LIST

Patent Literature

Patent Literature 1: JP 2013-125647 A

SUMMARY OF INVENTION

Technical Problem

In the superconducting cable including the double pipe of the inner pipe and the outer pipe, for example, from the viewpoint of transporting the superconducting cable before installation in a state of being wound around a drum or from the viewpoint of a degree of freedom in designing a space for installing the superconducting cable, it is desirable that the entire superconducting cable has the flexibility, and it is desirable to use a flexible corrugated pipe as the inner pipe.

However, an inner peripheral surface of the inner pipe made of the corrugated pipe has unevenness. For this reason, when the coolant flows through the inner pipe, due to the unevenness on the inner peripheral surface of the inner pipe, turbulence occurs in the coolant, which results in causing pressure loss of the coolant. In this case, since the coolant is circulated between the long superconducting cable and the cooling device, it is necessary to increase a pressure for compressing the coolant by the pump and increase pressure resistance of each part of the superconducting cable including the corrugated pipe, which results in increasing the installation cost of the feeder line or increasing the manufacturing cost of the superconducting cable.

The present invention has been made to solve the above-described problems of the conventional technology and an object thereof is to provide a superconducting cable which includes an inner pipe and an outer pipe, in which an outgoing coolant flows through the inner pipe and a returning coolant flows between the inner pipe and the outer pipe, and which has flexibility and can reduce pressure loss of the coolant when the coolant flows through the inner pipe.

Solution to Problem

The following is the brief description of an outline of a typical invention among inventions disclosed in the present application.

A superconducting cable as one aspect of the present invention includes a superconducting cable core and a storage pipe part storing the superconducting cable core. The superconducting cable core has a first corrugated pipe, a superconductor provided on the outer peripheral side of the first corrugated pipe, and a first heat insulating pipe that is stored in the first corrugated pipe, has a smooth inner peripheral surface, and is made of a first heat insulating material. A first flow passage through which a coolant for cooling the superconducting cable core flows is formed in the first heat insulating pipe, and a second flow passage through which the coolant flows is formed between an outer peripheral surface of the first corrugated pipe and an inner peripheral surface of the storage pipe part. The coolant flows through the first flow passage from the first side toward the side opposite to the first side in a length direction of the superconducting cable core, and the coolant after flowing through the first flow passage flows through the second flow passage from the side opposite to the first side toward the first side in the length direction of the superconducting cable core.

Further, as another aspect, the flexibility of the first heat insulating pipe may be higher than the flexibility of the first corrugated pipe.

Further, as another aspect, the first corrugated pipe may include a plurality of first diameter parts arranged along the length direction of the superconducting cable core and each having a first inner diameter, and a plurality of second diameter parts arranged along the length direction of the superconducting cable core and each having a second inner diameter smaller than the first inner diameter, and the plurality of first diameter parts and the plurality of second diameter parts may be disposed alternately one by one along the length direction of the superconducting cable core. In addition, an outer peripheral surface of the first heat insulating pipe may contact an inner peripheral surface of each of the plurality of second diameter parts.

Further, as another aspect, the coolant may be stored between the outer peripheral surface of the first heat insulating pipe and an inner peripheral surface of each of the plurality of first diameter parts.

Further, as another aspect, the first corrugated pipe may be made of stainless steel, and the first heat insulating material may be polytetrafluoroethylene.

Further, as another aspect, the storage pipe part may have a second corrugated pipe and a second heat insulating pipe that is stored in the second corrugated pipe, has a smooth inner peripheral surface, and is made of a second heat insulating material. The superconducting cable core may be stored in the second heat insulating pipe, and the second flow passage may be formed between an outer peripheral surface of the first corrugated pipe and an inner peripheral surface of the second heat insulating pipe.

Further, as another aspect, the flexibility of the second heat insulating pipe may be higher than the flexibility of the first corrugated pipe and than the flexibility of the second corrugated pipe.

Further, as another aspect, the second corrugated pipe may include a plurality of third diameter parts arranged along the length direction of the superconducting cable core and each having a third inner diameter, and a plurality of fourth diameter parts arranged along the length direction of the superconducting cable core and each having a fourth inner diameter smaller than the third inner diameter, and the plurality of third diameter parts and the plurality of fourth diameter parts may be disposed alternately one by one along the length direction of the superconducting cable core. In addition, an outer peripheral surface of the second heat insulating pipe may contact an inner peripheral surface of each of the plurality of fourth diameter parts.

Further, as another aspect, the coolant may be stored between the outer peripheral surface of the second heat insulating pipe and an inner peripheral surface of each of the plurality of third diameter parts.

Further, as another aspect, the second corrugated pipe may be made of stainless steel, and the second heat insulating material may be polytetrafluoroethylene.

Further, as another aspect, the storage pipe part may be an insulating pipe part that thermally insulates the stored superconducting cable core from the outside, the insulating pipe part may have a storage pipe that stores the second corrugated pipe, and a space between an outer peripheral surface of the second corrugated pipe and an inner peripheral surface of the storage pipe may be evacuated.

Further, as another aspect, the superconducting cable core may have a heat insulating layer that covers the outer peripheral surface of the first corrugated pipe and is made of a third heat insulating material, and the superconductor may be provided on the outer peripheral side of the heat insulating layer.

Further, as another aspect, the superconductor may include a first superconducting layer provided on the outer peripheral side of the heat insulating layer, an electrically insulating layer covering the first superconducting layer, and a second superconducting layer provided on the outer peripheral side of the electrically insulating layer.

Advantageous Effects of Invention

By applying one aspect of the present invention, a superconducting cable which includes an inner pipe and an outer pipe and in which an outgoing coolant flows through the inner pipe and a returning coolant flows between the inner pipe and the outer pipe has flexibility and can reduce pressure loss of the coolant when the coolant flows through the inner pipe.

DESCRIPTION OF EMBODIMENTS

Figure 1:
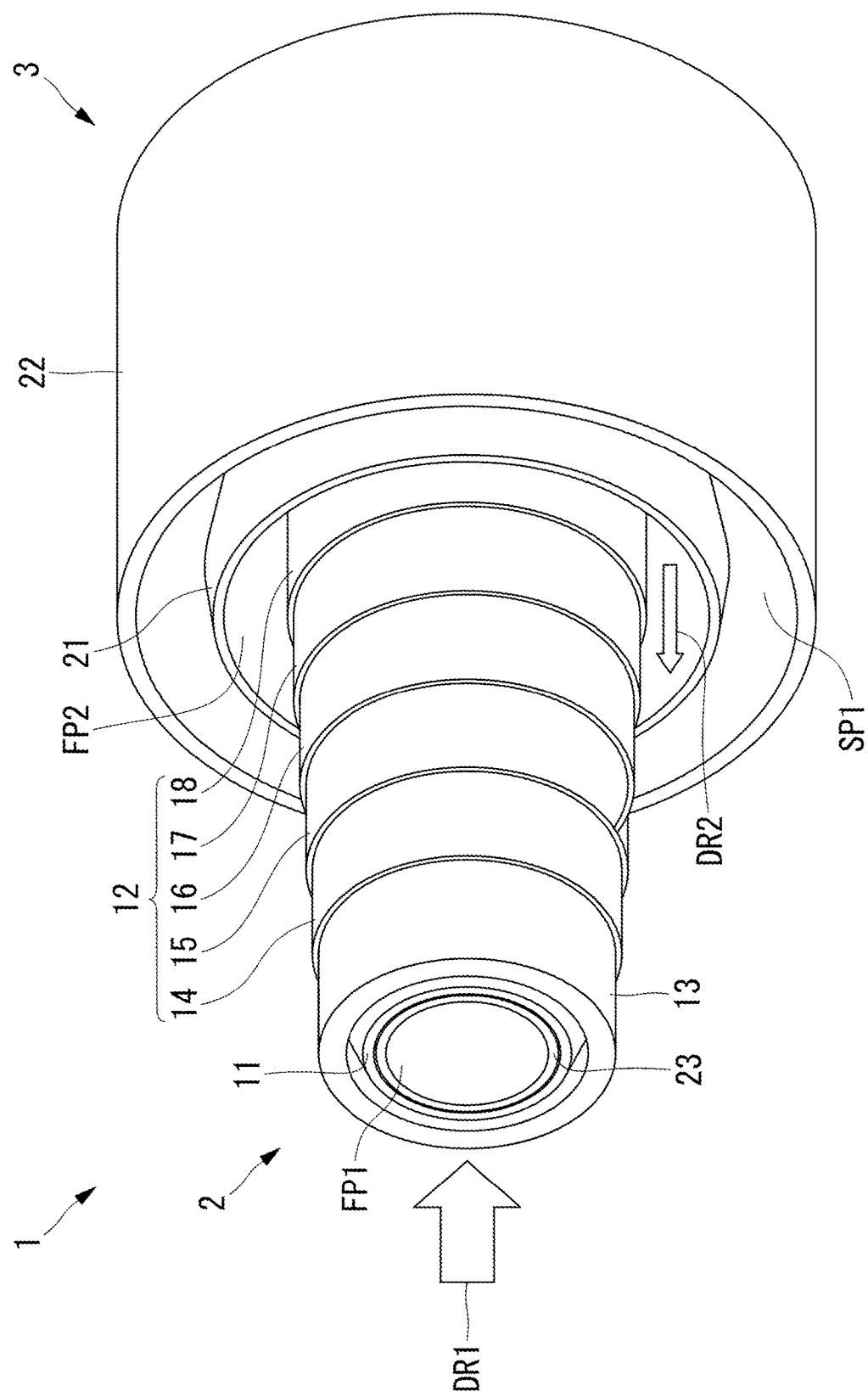
FIG. 1 is a perspective view schematically showing a configuration of an example of a superconducting cable according to an embodiment.

Embodiments and modifications of the present invention will be described below with reference to the drawings.

Note that the disclosure is merely an example, and appropriate changes that can be easily conceived by those skilled in the art while keeping the gist of the invention are naturally included in the scope of the present invention. Further, in order to make the description clearer, the drawings may schematically show the width, thickness, shape, etc. of each part as compared with the embodiment. However, this is merely an example, and does not limit the interpretation of the present invention.

Further, in the present specification and the drawings, the same elements as those described above with reference to the already-existing drawings are denoted by the same reference numerals, and the detailed description thereof may be appropriately omitted.

Further, in the drawings used in the embodiments, hatching may be omitted even in a cross-sectional view in order to make the drawings easily recognized. Further, hatching may be added even in a plan view in order to make the drawings easily recognized.

Embodiment

<Superconducting Cable>

Hereinafter, a superconducting cable according to an embodiment of the present invention will be described in comparison with a superconducting cable according to a comparative example. Note that the superconducting cable according to the present embodiment is used in a feeder line for supplying power to an electric vehicle as a railway vehicle.

Figure 2:
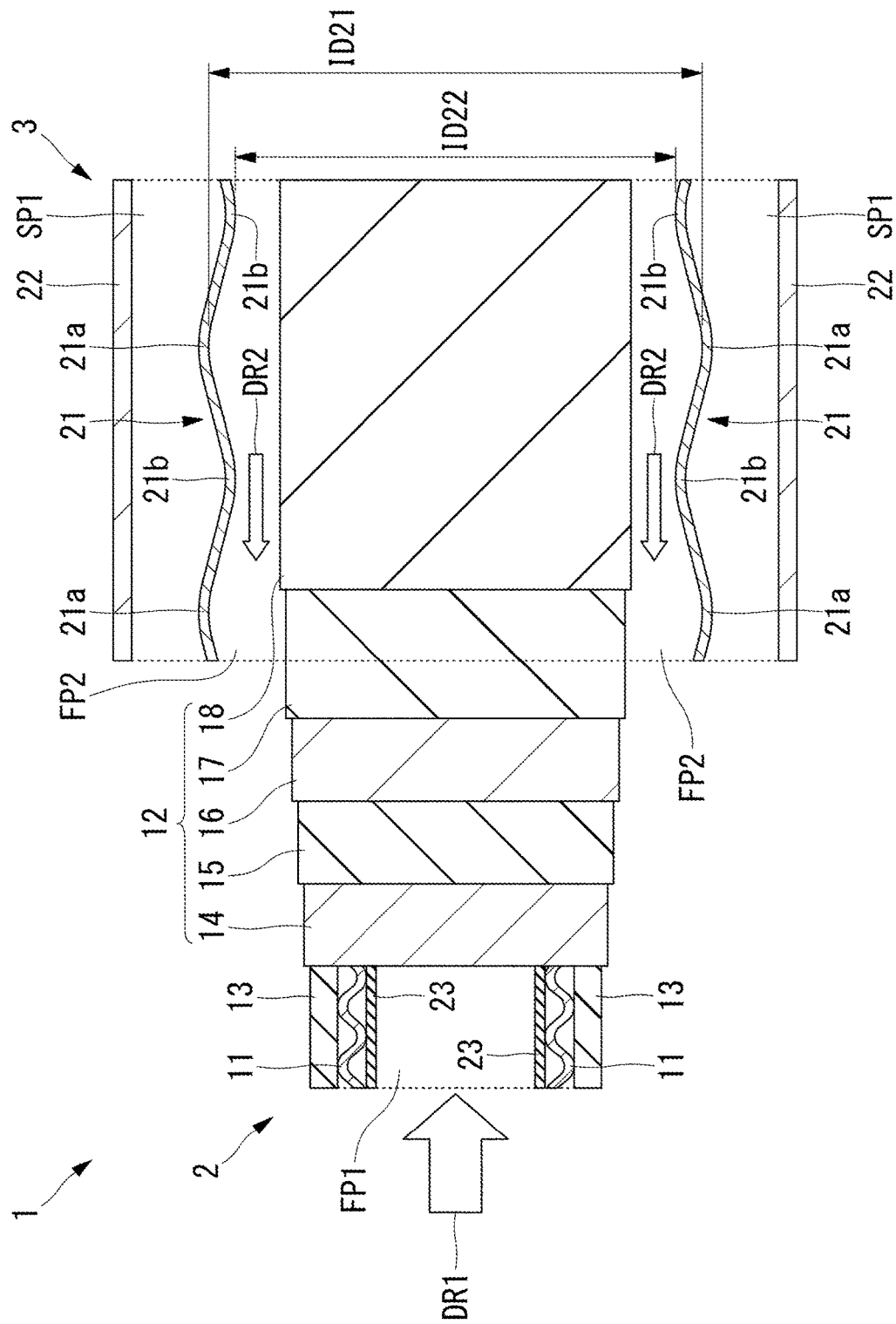
FIG. 2 is a cross-sectional view schematically showing a configuration of an example of a superconducting cable according to an embodiment.
Figure 3:
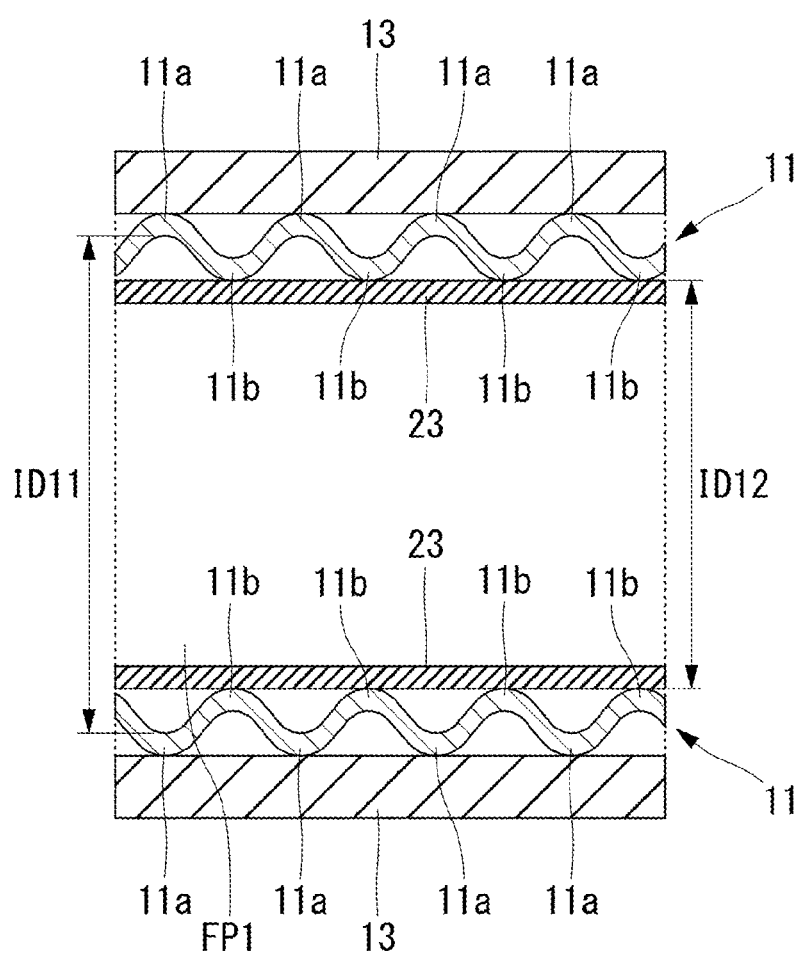
FIG. 3 is a cross-sectional view schematically showing a configuration of an example of a superconducting cable according to an embodiment.
Figure 4:
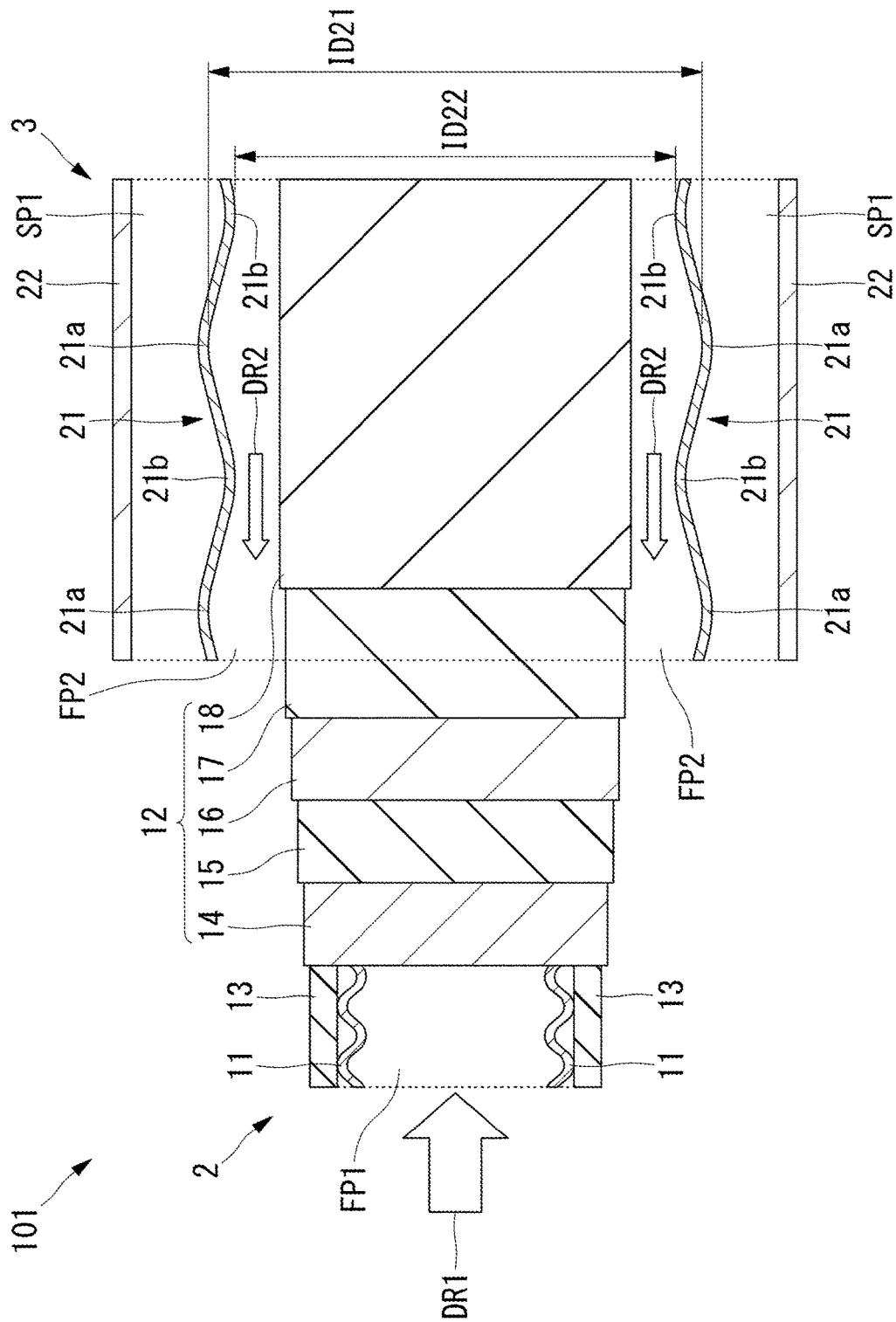
FIG. 4 is a cross-sectional view schematically showing a configuration of a superconducting cable according to a comparative example.

FIG. 1 is a perspective view schematically showing a configuration of an example of the superconducting cable according to the embodiment. FIGS. 2 and 3 are cross-sectional views schematically showing a configuration of an example of the superconducting cable according to the embodiment. FIG. 3 is an enlarged view in which a part of FIG. 2 is enlarged. FIG. 4 is a cross-sectional view schematically showing a configuration of the superconducting cable according to the comparative example.

First, in a superconducting cable 1 according to the present embodiment shown in FIGS. 1 to 3, parts similar to those of a superconducting cable 101 according to the comparative example shown in FIG. 4 will be described.

The superconducting cable 1 according to the present embodiment includes a superconducting cable core 2 and an insulating pipe part 3. The insulating pipe part 3 is a storage pipe part storing the superconducting cable core 2 inside. Preferably, the insulating pipe part 3 thermally insulates the superconducting cable core 2 stored inside from the outside.

The superconducting cable core 2 has a corrugated pipe 11 and a superconductor 12 provided on the outer peripheral side of the corrugated pipe 11.

The corrugated pipe has a corrugated shape or a bellows shape, is formed by corrugating a metal pipe, and is also referred to as a corrugated pipe or a bellows pipe. Therefore, the corrugated pipe 11 includes a plurality of diameter parts (mountain parts) 11$a$ arranged along a length direction of the superconducting cable core 2 and each having an inner diameter ID11, and a plurality of diameter parts (valley parts) 11$b$ arranged along the length direction of the superconducting cable core 2 and each having an inner diameter ID12 smaller than the inner diameter ID11. The plurality of diameter parts 11$a$ and the plurality of diameter parts 11$b$ are disposed alternately one by one along the length direction of the superconducting cable core 2.

As a result, the corrugated pipe 11 can be bent so as to have a radius equal to or larger than a minimum bending radius, and the corrugated pipe 11 has flexibility. Note that, in the present specification, the corrugated pipe 11 having flexibility means that, for example, the minimum bending radius of the corrugated pipe 11 is substantially equal to or less than 20 times the inner diameter ID12 of the diameter part lib of the corrugated pipe 11.

As the corrugated pipe 11, the corrugated pipe 11 may have flexibility as described above and may have rigidity. For example, a corrugated pipe made of a metal can be used, but a corrugated pipe made of stainless steel is preferably used. Stainless steel is also referred to as stainless steel, and means alloy steel containing iron as a main component (50 mass % or more) and containing chromium of 10.5 mass % or more, which is hard to rust. As the stainless steel, martensitic stainless steel, ferritic stainless steel, austenitic stainless steel, austenitic-ferrite duplex stainless steel, or precipitation hardening stainless steel can be used.

In a case where the superconducting cable core 2 has a pipe having no flexibility instead of the corrugated pipe 11, when the long superconducting cable is wound around a drum, the pipe is deformed unevenly and stress is applied to the superconductor 12, so that superconducting characteristics such as a critical current of the superconductor 12 may be degraded. On the other hand, in a case where the superconducting cable core 2 has the flexible corrugated pipe 11, it is possible to prevent or suppress occurrence of a situation where, when the long superconducting cable is wound around the drum, the corrugated pipe 11 is deformed unevenly and the stress is applied to the superconductor 12, and it is possible to prevent or suppress degradation of the superconducting characteristics of the superconductor 12.

As shown in FIGS. 1 to 3, the superconducting cable core 2 may have a heat insulating layer 13 that covers the outer peripheral surface of the corrugated pipe 11 and is made of a heat insulating material. In this case, the superconductor 12 is provided on the outer peripheral side of the heat insulating layer 13. That is, the superconductor 12 is provided on the outer peripheral surface of the corrugated pipe 11 with the heat insulating layer 13 interposed therebetween. Note that the heat insulating layer 13 can be provided on the outer peripheral side of the superconductor 12.

Preferably, the heat insulating layer 13 is made of semi-synthetic paper obtained by bonding insulating paper and a polypropylene film or the like, polytetrafluoroethylene (PTFE), or nylon. That is, preferably, the heat insulating material of the heat insulating layer 13 is polytetrafluoroethylene or nylon. Polytetrafluoroethylene and nylon have excellent heat insulating properties, are inexpensive, and are easily available. Further, the heat insulating layer 13 made of polytetrafluoroethylene or nylon has flexibility. Further, the heat insulating layer 13 made of polytetrafluoroethylene and nylon is slidable, and even if thermal contraction due to cooling occurs, the superconductor 12 provided on the outer peripheral side of the heat insulating layer 13 can be slid, and the application of stress to the superconductor 12 can be prevented or suppressed by the heat insulating layer 13.

The superconductor 12 may include a superconducting layer 14 provided on the outer peripheral side of the heat insulating layer 13, an electrically insulating layer 15 covering the superconducting layer 14, a shield superconducting layer 16 provided on the outer peripheral side of the electrically insulating layer 15, an electrically insulating layer 17 covering the shield superconducting layer 16, and a conductor protecting layer 18 provided on the outer peripheral side of the electrically insulating layer 17.

When the superconducting cable 1 is operated as a feeder line, the superconducting layer 14 is a part through which a superconducting current as a transmission current flows. In the existing railway system, the shield superconducting layer 16 returns a current to a substation or the like via a rail, but it is a part where the current flows or a part where the shield current flows. For example, the superconducting current whose direction is opposite to a direction of the superconducting current flowing through the superconducting layer 14 is flown through the shield superconducting layer 16 to generate a magnetic field, so that the magnetic field generated by the superconducting current flowing through the superconducting layer 14 can be prevented or suppressed from being applied to the outer peripheral side of the shield superconducting layer 16. Alternatively, the shield superconducting layer 16 may prevent or suppress the magnetic field on the outer peripheral side of the shield superconducting layer 16 from being applied to the superconducting layer 14.

The heat insulating layer 13 thermally insulates the corrugated pipe 11 and the superconductor 12 from each other, the electrically insulating layer 15 electrically insulates the superconducting layer 14 and the shield superconducting layer 16 from each other, the electrically insulating layer 17 electrically insulates the superconductor 12 from the outside, and the conductor protecting layer 18 mechanically protects the superconductor 12 from the outside.

The superconducting layer 14 is formed of a plurality of superconducting wire rods provided on the outer peripheral side of the heat insulating layer 13 around the corrugated pipe 11, for example, a plurality of superconducting wire rods spirally wound around the corrugated pipe 11 with the heat insulating layer 13 interposed therebetween. As the plurality of superconducting wire rods forming the superconducting layer 14, for example, a material obtained by sequentially forming an intermediate layer, a superconducting layer, and a protecting layer on a tape-shaped metal substrate can be used.

The electrically insulating layer 15 is formed of, for example, insulating paper wound around the corrugated pipe 11 so as to cover the superconducting layer 14, or semi-synthetic paper obtained by bonding the insulating paper and the polypropylene film or the like.

The shield superconducting layer 16 is formed of a plurality of superconducting wire rods provided on the outer peripheral side of the electrically insulating layer 15 around the corrugated pipe 11, for example, a plurality of superconducting wire rods spirally wound around the corrugated pipe 11 with the electrically insulating layer 15 interposed therebetween. As the plurality of superconducting wire rods forming the shield superconducting layer 16, similarly to the superconducting layer 14, for example, a material obtained by sequentially forming an intermediate layer, a superconducting layer, and a protecting layer on a tape-shaped metal substrate can be used.

The electrically insulating layer 17 is formed of, for example, insulating paper wound around the corrugated pipe 11 so as to cover the shield superconducting layer 16, or semi-synthetic paper obtained by bonding the insulating paper and the polypropylene film or the like.

The conductor protecting layer 18 is formed of, for example, insulating paper wound around the corrugated pipe 11 so as to cover the electrically insulating layer 17, or polymer nonwoven fabric or the like.

According to the structure of the superconductor 12 described above, the superconducting layer 14 and the shield superconducting layer 16 are provided on the outer peripheral side of the corrugated pipe 11. Therefore, the power lead can be easily connected to the superconducting layer 14 and the shield superconducting layer 16 at a position in the middle of the length direction of the superconducting cable core 2.

The insulating pipe part 3 may have a corrugated pipe 21 and a storage pipe 22 storing the corrugated pipe 21. In this case, a space SP1 between an inner peripheral surface of the storage pipe 22 and an outer peripheral surface of the corrugated pipe 21 can be evacuated. As a result, the superconducting cable core 2 stored in the insulating pipe part 3 can be thermally insulated from the outside.

The corrugated pipe 21 includes a plurality of diameter parts (mountain parts) 21a arranged along a length direction of the superconducting cable core 2 and each having an inner diameter ID21, and a plurality of diameter parts (valley parts) 21b arranged along the length direction of the superconducting cable core 2 and each having an inner diameter ID22 smaller than the inner diameter ID21. The plurality of diameter parts 21a and the plurality of diameter parts 21b are disposed alternately one by one along the length direction of the superconducting cable core 2.

As a result, the corrugated pipe 21 can be bent so as to have a radius equal to or larger than a minimum bending radius, and the corrugated pipe 21 has flexibility. The meaning of the flexibility of the corrugated pipe 21 can be defined similarly to the meaning of the flexibility of the corrugated pipe 11. Further, as the corrugated pipe 21, similarly to the corrugated pipe 11, the corrugated pipe 21 may have flexibility as described above and may have rigidity. For example, a corrugated pipe made of a metal can be used, but a corrugated pipe made of stainless steel is preferably used.

In both the superconducting cable 1 according to the present embodiment and the superconducting cable 101 according to the comparative example, a flow passage FP1 through which a coolant for cooling the superconducting cable core 2 flows is formed in the corrugated pipe 11, and a flow passage FP2 through which the coolant flows is formed between the outer peripheral surface of the corrugated pipe 11 and the inner peripheral surface of the corrugated pipe 21, that is, the insulating pipe part 3. The flow passage FP1 is a flow passage as an outgoing passage through which an outgoing coolant that is sent from the cooling device and introduced into the superconducting cable 1 and then goes from an end part 32 (refer to FIG. 5 described later) on the first side of the insulating pipe part 3 to an end part 33 (refer to FIG. 5 described later) on the side opposite to the first side of the insulating pipe part 3 flows. The flow passage FP2 is a flow passage as a returning passage through which a returning coolant returning from the end part 33 of the insulating pipe part 3 to the end part 32 of the insulating pipe part 3 flows in order for the returning coolant to be discharged from the superconducting cable 1 and return to the cooling device.

Further, in both the superconducting cable 1 according to the present embodiment and the superconducting cable 101 according to the comparative example, the coolant flows through the flow passage FP1 formed in the corrugated pipe 11, from the end part EP1 (refer to FIG. 5 described later) on the first side in the length direction of the superconducting cable core 2 toward the end part EP2 (refer to FIG. 5 described later) on the side opposite to the first side in the length direction of the superconducting cable core 2, that is, in a direction DR1 shown in FIGS. 1, 2, and 4. Then, the coolant after flowing through the flow passage FP1 flows through the flow passage FP2 formed between the outer peripheral surface of the corrugated pipe 11 and the inner peripheral surface of the corrugated pipe 21, that is, the insulating pipe part 3, from the end part EP2 on the side opposite to the first side in the length direction of the superconducting cable core 2 toward the end part EP1 on the first side in the length direction of the superconducting cable core 2, that is, in a direction DR2 shown in FIGS. 1, 2, and 4. At this time, since the superconductor 12 is stored in the flow passage FP2 as the returning passage, the superconductor 12 is mainly cooled by the coolant flowing through the flow passage FP2 as the returning passage. That is, the superconductor 12 is cooled by return flow cooling.

As described above, unlike the case where the superconducting cable is used as the power transmission line for transmitting the AC power, in the case where the superconducting cable is used as the feeder line for the electric railway, a plurality of power leads may be provided, each of which is connected to each of a plurality of parts of the superconductor disposed at intervals from each other and which supplies power to a trolley wire. Therefore, the superconducting cable used as the feeder line is required to have a structure capable of easily branching a current from the superconducting cable, and has a structure different from a structure of the superconducting cable used as the power transmission line.

Further, in the case where the superconducting cable is used as the feeder line, only one feeder line is normally laid. For this reason, unlike the case where the superconducting cable is used as the power transmission line, it is difficult to provide an outgoing passage through which an outgoing coolant flows in one line and provide a returning passage through which a returning coolant flows in other line. Further, in the superconducting cable used as the feeder line, DC power is supplied. For this reason, unlike a superconducting cable to which three-phase AC power is supplied, it is difficult to provide an outgoing passage through which an outgoing coolant flows in a one-phase superconducting cable and provide a returning passage through which a returning coolant flows in the two-phase superconducting cable. For example, when the cold heat of the coolant can be used only in the outgoing passage through which the outgoing coolant flows, the cold heat of the coolant cannot be effectively used.

As described above, a structure of the flow passage through which the coolant flows in the superconducting cable used as the feeder line may be different from a structure of the flow passage in the superconducting cable used as the power transmission line. That is, the cooling device for cooling the superconducting cable used as the feeder line may have a structure different from a structure of the cooling device for cooling the superconducting cable used as the power transmission line.

Also, a method is considered in which two or more superconducting cable cores are provided in parallel with each other without separately providing a line provided with the returning passage through which the returning coolant flows, the outgoing passage is provided in one superconducting cable core and the returning passage is provided in other superconducting cable core, and the cold heat of the coolant is effectively used. However, in this case, even in a section where only one superconducting cable core is required, two or more superconducting cable cores are provided, so that the installation cost of the superconducting cable increases and the width dimension of the superconducting cable in the radial direction increases. As a result, since the structure also becomes complicated, the above method is not realistic.

On the other hand, in both the superconducting cable 1 according to the present embodiment and the superconducting cable 101 according to the comparative example, as described above, after flowing through the corrugated pipe 11 in the direction DR1, the coolant flows between the outer peripheral surface of the corrugated pipe 11 and the inner peripheral surface of the insulating pipe part 3 in the direction DR2. Further, the superconductor 12 is cooled by the coolant flowing through the flow passage FP2 as the returning passage, and is cooled by so-called return flow cooling. As a result, it is possible to use the cold heat of the coolant for two times of outgoing and returning of the coolant only by installing one superconducting cable. Further, the structure of the superconducting cable can be simplified. Therefore, as compared with the case where two or more superconducting cables or superconducting cable cores are provided to circulate the coolant, the manufacturing cost of the superconducting cable can be reduced and the installation cost can be reduced.

Further, the corrugated pipe 11 has the flexibility, so that it is possible to transport the superconducting cable before installation, for example, in a state of being wound around the drum. Therefore, the installation cost of the superconducting cable can be reduced. Further, the corrugated pipe 11 has the flexibility, so that the superconducting cable can be bent even at the bending radius substantially equal to the minimum bending radius, and the degree of freedom in designing the space for installing the superconducting cable is increased. Therefore, the installation cost of the superconducting cable can be reduced.

Further, even in the superconducting cable 1 according to the present embodiment and the superconducting cable 101 according to the comparative example, the superconducting cable has the structure capable of easily branching the current, and the plurality of power leads that are respectively connected to the plurality of parts of the superconductor disposed at intervals from each other along the superconducting cable and supply power to the trolley wire can be easily provided. Therefore, both the superconducting cable 1 according to the present embodiment and the superconducting cable 101 according to the comparative example have the structure different from the structure of the superconducting cable used as the power transmission line and are suitable for being used as the feeder lines.

Further, even in both the superconducting cable 1 according to the present embodiment and the superconducting cable 101 according to the comparative example, by providing only one superconducting cable core 2, the outgoing passage through which the outgoing coolant flows and the returning passage through which the returning coolant flows can be provided. Therefore, the installation cost of the superconducting cable can be reduced, the width dimension of the superconducting cable in the radial direction can be reduced, and the structure can be simplified.

Next, different parts between the superconducting cable 1 according to the present embodiment and the superconducting cable 101 according to the comparative example will be described in comparison with the superconducting cable 101 according to the comparative example.

In the superconducting cable 1 according to the present embodiment, as shown in FIGS. 1 and 2, the superconducting cable core 2 has the heat insulating pipe 23 that is stored in the corrugated pipe 11, has the smooth inner peripheral surface, and is made of a heat insulating material. However, in the superconducting cable 101 according to the comparative example, as shown in FIG. 4, the superconducting cable core 2 does not have the heat insulating pipe 23 (refer to FIGS. 1 and 2).

As described above, the corrugated pipe 11 includes the plurality of diameter parts (mountain parts) 11a and the plurality of diameter parts (valley parts) 11b that are disposed alternately one by one, and the inner peripheral surface of the corrugated pipe 11 has the unevenness. That is, the corrugated pipe 11 does not have a smooth inner peripheral surface. Therefore, in the superconducting cable 101 according to the comparative example, the coolant flowing through the flow passage FP1 as the outgoing passage flows along the unevenness of the inner peripheral surface of the corrugated pipe 11, and when the coolant flows through the flow passage FP1 as the outgoing passage, turbulence occurs in the coolant due to the unevenness of the inner peripheral surface of the corrugated pipe 11.

As the coolant, for example, a coolant compressed to a high pressure of about 1 MPa by the pump is introduced into the end part 32 (refer to FIG. 5 described later) of the insulating pipe part 3, and then flows through the flow passage FP1, that is, the corrugated pipe 11 from the end part EP1 (refer to FIG. 5 described later) of the superconducting cable core 2 toward the end part EP2 (refer to FIG. 5 described later). However, since the inner peripheral surface of the corrugated pipe 11 has the unevenness as described above, turbulence occurs in the coolant flowing through the flow passage FP1, that is, the corrugated pipe 11, and pressure loss of the coolant occurs.

Therefore, in the comparative example, since the coolant is circulated between the long superconducting cable and the cooling device, it is necessary to increase a pressure for compressing the coolant with the pump and increase pressure resistance of each part of the superconducting cable including the corrugated pipe 11, which results in increasing the installation cost of the feeder line or increasing the manufacturing cost of the superconducting cable.

Further, in a case where heat is easily exchanged between the coolant flowing through the flow passage FP1 as the outgoing passage and the corrugated pipe 11, when a distance from the end part EP1 (refer to FIG. 5 described later) of the superconducting cable core 2 increases, the temperature of the coolant flowing through the flow passage FP1 as the outgoing passage increases, and the efficiency of cooling the superconductor 12 by the coolant flowing through the flow passage FP2 as the returning passage decreases. Therefore, for example, the temperature at which the coolant discharged from the superconducting cable and returned to the cooling device after flowing through the flow passage FP2 as the returning passage is cooled by the cooling device needs to be set lower. As a result, the installation cost of the superconducting cable may increase, or the superconductor 12 may not be cooled sufficiently.

On the other hand, in the superconducting cable 1 according to the present embodiment, the superconducting cable core 2 has the heat insulating pipe 23 that is stored in the corrugated pipe 11, has a smooth inner peripheral surface, and is made of a heat insulating material. The heat insulating pipe 23 is an inner peripheral surface smoothing member that smooths the inner peripheral surface of the corrugated pipe 11.

Further, the present embodiment is similar to the comparative example in that the flow passage FP1 through which the coolant for cooling the superconducting cable core 2 flows is formed in the corrugated pipe 11. However, the present embodiment is different from the comparative example in that the flow passage FP1 is formed in the heat insulating pipe 23, not between the outer peripheral surface of the heat insulating pipe 23 and the inner peripheral surface of the corrugated pipe 11.

The superconducting cable 1 according to the present embodiment is the same as the superconducting cable 101 according to the comparative example in that the flow passage FP2 through which the coolant flows is formed between the outer peripheral surface of the corrugated pipe 11 and the inner peripheral surface of the corrugated pipe 21, that is, the insulating pipe part 3. Further, the flow passage FP1 is a flow passage as the outgoing passage through which the outgoing coolant sent from the cooling device and introduced into the superconducting cable 1 flows, and the flow passage FP2 is a flow passage as the returning passage through which the returning coolant discharged from the superconducting cable 1 and returning to the cooling device flows. Note that the outgoing passage and the returning passage are established even if they are reversed.

Therefore, in the present embodiment, unlike the comparative example, the coolant flows through the flow passage FP1 formed in the heat insulating pipe 23, from the end part EP1 (refer to FIG. 5 described later) on the first side in the length direction of the superconducting cable core 2 toward the end part EP2 (refer to FIG. 5 described later) on the side opposite to the first side in the length direction of the superconducting cable core 2, that is, in the direction DR1 shown in FIGS. 1 and 2.

The present embodiment is the same as the comparative example in that the coolant after flowing through the flow passage FP1 flows through the flow passage FP2 formed between the outer peripheral surface of the corrugated pipe 11 and the inner peripheral surface of the corrugated pipe 21, that is, the insulating pipe part 3, from the end part EP2 of the superconducting cable core 2 toward the end part EP1 of the superconducting cable core 2, that is, in the direction DR2 shown in FIGS. 1 and 2.

In this case, when the coolant flows through the flow passage FP1, there is no unevenness on the inner peripheral surface of the heat insulating pipe 23, so that the occurrence of turbulence in the coolant can be prevented or suppressed, and the pressure loss of the coolant flowing through the flow passage FP1 can be reduced. Therefore, even when the coolant is circulated between the long superconducting cable and the cooling device, it is less necessary to increase the pressure for compressing the coolant by the pump, and it is less necessary to increase pressure resistance of each part of the superconducting cable including the corrugated pipe 11. As a result, the installation cost of the feeder line can be reduced, and the manufacturing cost of the superconducting cable can be reduced.

That is, according to the present embodiment, even when the superconducting cable includes the inner pipe and the outer pipe, the outgoing coolant flows through the inner pipe, and the returning coolant flows between the outer peripheral surface of the inner pipe and the inner peripheral surface of the outer pipe, the outgoing coolant flows through the heat insulating pipe 23 stored in the corrugated pipe 11 as the inner pipe, so that the superconducting cable has the flexibility, and the pressure loss of the coolant when the coolant flows through the corrugated pipe 11 can be reduced.

Further, when the heat insulating pipe 23 is made of a heat insulating material, heat exchange between the coolant flowing through the flow passage FP1 as the outgoing passage and the corrugated pipe 11 is difficult to occur. For this reason, even at a position away from the end part EP1 (refer to FIG. 5 described later) of the superconducting cable core 2, an increase in the temperature of the coolant flowing through the flow passage FP1 as the outgoing passage can be suppressed, and the efficiency of cooling the superconductor 12 by the coolant flowing through the flow passage FP2 as the returning passage can be improved. Therefore, for example, the temperature at which the coolant discharged from the superconducting cable and returned to the cooling device after flowing through the flow passage FP2 as the returning passage is cooled by the cooling device can be set higher. As a result, the installation cost of the superconducting cable can be reduced, or the superconductor 12 can be sufficiently cooled.

Preferably, the heat insulating pipe 23 is made of polytetrafluoroethylene, nylon, or the like. That is, preferably, the heat insulating material of the heat insulating pipe 23 is polytetrafluoroethylene or nylon. As described above, polytetrafluoroethylene and nylon have excellent heat insulating properties, are inexpensive, and are easily available. Further, the heat insulating pipe 23 made of polytetrafluoroethylene or nylon has the flexibility. Further, the heat insulating pipe 23 made of polytetrafluoroethylene and nylon is slidable, and even if thermal contraction due to cooling occurs, the corrugated pipe 11 provided on the outer peripheral side of the heat insulating pipe 23 can be slid, and the application of stress to the corrugated pipe 11 can be prevented or suppressed by the heat insulating pipe 23.

Preferably, the heat insulating pipe 23 has the flexibility, and the flexibility of the heat insulating pipe 23 is higher than the flexibility of the corrugated pipe 11. That is, the minimum bending radius of the heat insulating pipe 23 is smaller than the minimum bending radius of the corrugated pipe 11. As a result, even when the heat insulating pipe 23 is bent with a bending radius substantially equal to the minimum bending radius of the corrugated pipe 11, the bending radius can be prevented from becoming smaller than the minimum bending radius of the heat insulating pipe 23.

Preferably, the outer peripheral surface of the heat insulating pipe 23 contacts the inner peripheral surface of each of the plurality of diameter parts 1ib included in the corrugated pipe 11. That is, the outer diameter of the heat insulating pipe 23 is substantially equal to the inner diameter ID12 of each of the plurality of diameter parts 1ib. As a result, since it is possible to maximize the inner diameter of the heat insulating pipe 23 stored in the corrugated pipe 11, a cross-sectional area of the flow passage FP1 perpendicular to the length direction of the superconducting cable core 2 can be increased, and the pressure loss of the coolant flowing through the flow passage FP1 can be reduced.

Preferably, a state in which the coolant is stored, stays, or does not flow between the outer peripheral surface of the heat insulating pipe 23 and the inner peripheral surface of each of the plurality of diameter parts 11a included in the corrugated pipe 11 is realized. When the coolant is liquid nitrogen, a non-flowing coolant, that is, liquid nitrogen has thermal conductivity of about 0.15 (W/m/K), which is as small as the thermal conductivity of polytetrafluoroethylene, for example. For this reason, it is possible to prevent or suppress the heat exchange of the coolant flowing through the flow passage FP1 as the outgoing passage with the superconductor 12 and the like provided on the outer peripheral side of the corrugated pipe 11 via the corrugated pipe 11. Therefore, even when the superconducting cable is long, it is possible to suppress an increase in the temperature of the coolant flowing through the flow passage FP1 when the coolant flows through the flow passage FP1 as the outgoing passage, from the end part EP1 (refer to FIG. 5 described later) of the superconducting cable core 2 to the end part EP2 (refer to FIG. 5 described later) of the superconducting cable core 2.

The superconducting cable core 2 may have an inner peripheral surface smoothing member that is stored in the corrugated pipe 11, has a smoothed inner peripheral surface, is made of a heat insulating material, and smooths the inner peripheral surface of the corrugated pipe 11, instead of the heat insulating pipe 23. That is, it is sufficient that unevenness on the inner peripheral surface of the corrugated pipe 11 can be reduced as compared with a case where nothing is provided in the corrugated pipe 11. For this reason, the inner peripheral surface smoothing member may not have a tubular shape. Therefore, in the inner peripheral surface smoothing member, a cross-sectional shape perpendicular to the length direction of the superconducting cable core 2 may have, for example, a C shape or a U shape, or the cross-sectional shape perpendicular to the length direction of the superconducting cable core 2 may have, for example, a substantially H shape having two plate-shaped members disposed to face each other in the radial direction with a center axis therebetween and a fixing member for connecting and fixing the two plate-shaped members. Alternatively, a part of the peripheral side surface of the heat insulating pipe 23 is removed and the inner peripheral surface smoothing member may not have a tubular shape.

<Method for Manufacturing Superconducting Cable>

In a method for manufacturing the superconducting cable according to the present embodiment shown in FIGS. 1 to 3, first, the corrugated pipe 11 is formed around the heat insulating pipe 23 using the heat insulating pipe 23 as a core material. Next, using the corrugated pipe 11 as a core material, the heat insulating layer 13 that covers the outer peripheral surface of the corrugated pipe 11 and is made of a heat insulating material is formed.

Next, for example, a plurality of superconducting wire rods are spirally wound around the corrugated pipe 11 with the heat insulating layer 13 therebetween, so that the superconducting layer 14 made of the plurality of superconducting wire rods is formed on the outer peripheral side of the heat insulating layer 13.

Next, insulating paper or the like is wound around the corrugated pipe 11 to cover the superconducting layer 14, so that the electrically insulating layer 15 covering the superconducting layer 14 is formed.

Next, for example, superconducting wire rods are spirally wound around the corrugated pipe 11 with the electrically insulating layer 15 therebetween, so that the shield superconducting layer 16 made of a plurality of superconducting wire rods is formed on the outer peripheral side of the electrically insulating layer 15.

Next, insulating paper or the like is wound around the corrugated pipe 11 to cover the shield superconducting layer 16, so that the electrically insulating layer 17 covering the shield superconducting layer 16 is formed.

Next, insulating paper or the like is wound around the corrugated pipe 11 to cover the electrically insulating layer 17, so that the conductor protecting layer 18 is formed on the outer peripheral side of the electrically insulating layer 17.

As a result, the superconducting cable core 2 having the heat insulating pipe 23, the corrugated pipe 11, the heat insulating layer 13, the superconducting layer 14, the electrically insulating layer 15, the shield superconducting layer 16, the electrically insulating layer 17, and the conductor protecting layer 18 sequentially disposed from the center side toward the outer peripheral side is formed.

Next, the superconducting cable core 2 is inserted into the corrugated pipe 21 that stores the superconducting cable core 2. Next, by inserting the corrugated pipe 21 into the storage pipe 22 storing the corrugated pipe 21, the insulating pipe part 3 having the corrugated pipe 21 and the storage pipe 22 is formed, and the superconducting cable 1 including the superconducting cable core 2 and the insulating pipe part 3 is formed.

<Cooling Device>

Next, the cooling device for cooling the superconducting cable according to the present embodiment will be described. FIG. 5 is a cross-sectional view schematically showing configurations of the superconducting cable and the cooling device according to the embodiment. In FIG. 5, in order to facilitate understanding, illustration of the electrically insulating layer 17 and the conductor protecting layer 18 (refer to FIG. 2) among the layers included in the superconductor 12 is omitted. Further, in FIG. 5, in order to facilitate understanding, illustration of corrugated shapes of the corrugated pipes 11 and 21 is omitted. As the superconducting cable, a superconducting cable 1a (refer to FIG. 6) according to a modification of the embodiment to be described later can be used instead of the superconducting cable 1 according to the present embodiment.

Figure 5:
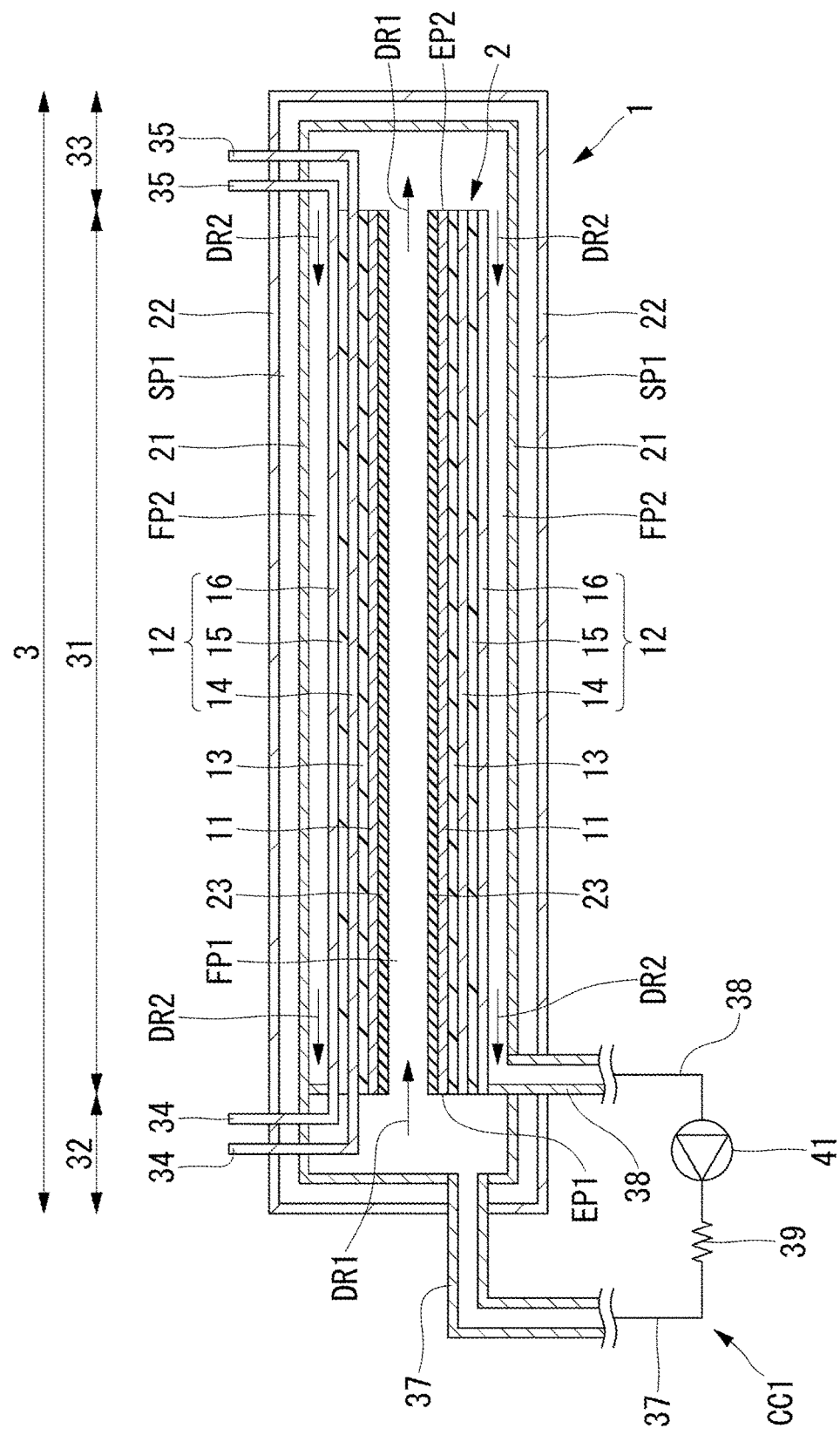
FIG. 5 is a cross-sectional view schematically showing configurations of a superconducting cable and a cooling device according to an embodiment.

As shown in FIG. 5, the insulating pipe part 3 of the superconducting cable 1 according to the present embodiment has a body part 31, an end part 32 disposed on the first side in the length direction of the superconducting cable core 2 with respect to the body part 31, and an end part 33 disposed on the side opposite to the first side in the length direction of the superconducting cable core 2 with respect to the body part 31. The superconducting cable core 2 is stored in the body part 31. The superconducting cable core 2 has the heat insulating pipe 23, the corrugated pipe 11, the heat insulating layer 13, the superconducting layer 14, the electrically insulating layer 15, and the shield superconducting layer 16, which are sequentially disposed from the center side in the radial direction of the superconducting cable core 2 toward the outer peripheral side. A coolant made of, for example, liquid nitrogen ($LN_2$) is introduced into the end part 32 of the insulating pipe part 3. The insulating pipe part 3 has the corrugated pipe 21 and the storage pipe 22.

Further, the superconducting cable core 2 has the end part EP1 disposed on the first side in the length direction of the superconducting cable core 2, that is, the side of the end part 32 of the insulating pipe part 3, and the end part EP2 disposed on the side opposite to the first side in the length direction of the superconducting cable core 2, that is, the side of the end part 33 of the insulating pipe part 3.

At the end part 33 of the insulating pipe part 3, the coolant is turned back. At the end parts 32 and 33 of the insulating pipe part 3, power leads 34 and 35, which are connection parts for flowing the current from the outside to the superconducting cable 1, are provided. The power leads 34 and 35 may also be provided in the body part 31 of the insulating pipe part 3. A pipe 37 for introducing the coolant into the end part 32 of the insulating pipe part 3 is connected to the end part 32 of the insulating pipe part 3, and a pipe 38 for discharging the coolant from the vicinity of the termination of the flow passage FP2 on the side of the end part EP1 of the superconducting cable core 2 is connected to the vicinity of the termination of the flow passage FP2 on the side of the end part EP1 of the superconducting cable core 2.

One end of the pipe 37 is connected to the end part 32 of the insulating pipe part 3 as described above, and the other end of the pipe 37 is connected to an outlet of a heat exchanger 39 provided in a storage tank (not shown) that stores liquid nitrogen cooled by, for example, a refrigerator (not shown). One end of the pipe 38 is connected to the vicinity of the termination of the flow passage FP2 on the side of the end part EP1 of the superconducting cable core 2 as described above, the other end of the pipe 38 is connected to an inlet of a circulation pump 41, and an outlet of the circulation pump 41 is connected to an inlet of the heat exchanger 39. As a result, a circulation circuit CC1 in which the coolant circulates in the order of the circulation pump 41, the heat exchanger 39, the pipe 37, the end part 32 of the insulating pipe part 3, the flow passage FP1, the end part 33 of the insulating pipe part 3, the flow passage FP2, the pipe 38, and the circulation pump 41 is formed. The heat exchanger can also be installed in front of the circulation pump.

When the superconducting cable core 2 is cooled, by driving the circulation pump 41, the coolant made of liquid nitrogen filled in the circulation circuit CC1 flows through the circulation circuit CC1 in the order of the circulation pump 41, the heat exchanger 39, the pipe 37, the end part 32 of the insulating pipe part 3, the flow passage FP1, the end part 33 of the insulating pipe part 3, the flow passage FP2, the pipe 38, and the circulation pump 41. As described above, the coolant flows through the flow passage FP1 in the direction DR1 and flows through the flow passage FP2 in the direction DR2. During the circulation, the coolant made of liquid nitrogen in the circulation circuit CC1 is cooled by exchanging heat with liquid nitrogen stored in the storage tank (not shown) and cooled by the refrigerator (not shown) in the heat exchanger 39. The coolant made of liquid nitrogen in the circulation circuit CC1 cooled by the heat exchange in the heat exchanger 39 flows through the flow passages FP1 and FP2, so that the superconducting cable core 2 is cooled.

Further, when the coolant in the circulation circuit CC1 flows through the flow passages FP1 and FP2, as described above, the outgoing coolant flows through the heat insulating pipe 23 stored in the corrugated pipe 11 as the inner pipe. Therefore, the superconducting cable has the flexibility, and the pressure loss of the coolant when the coolant flows through the corrugated pipe 11 can be reduced. As a result, as described above, the installation cost of the feeder line can be reduced, and the manufacturing cost of the superconducting cable can be reduced.

<Modification of Superconducting Cable>

Figure 6:
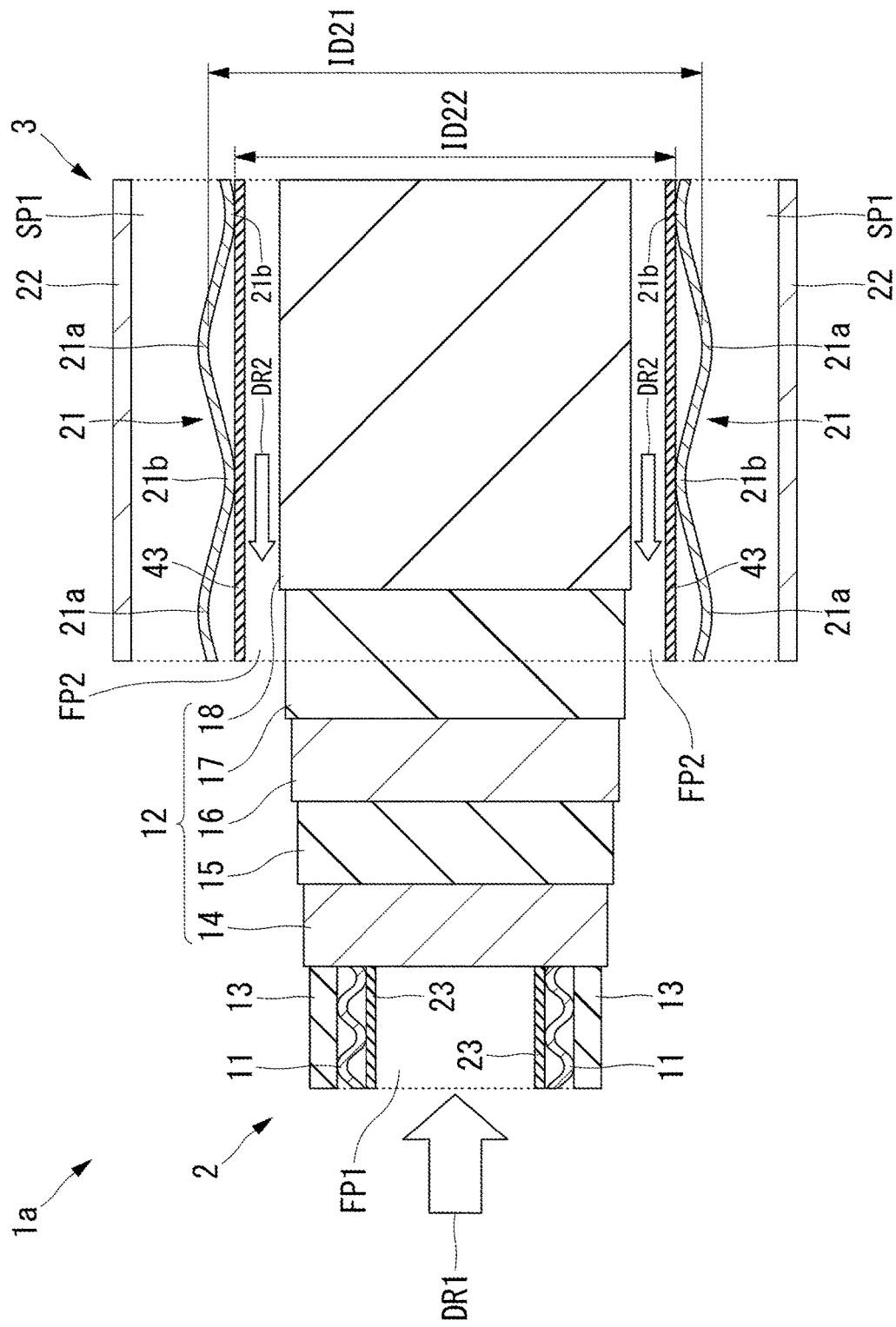
FIG. 6 is a cross-sectional view schematically showing a configuration of a superconducting cable according to a modification of an embodiment.

Next, a modification of the superconducting cable according to the present embodiment will be described. FIG. 6 is a cross-sectional view schematically showing a configuration of a superconducting cable according to a modification of the embodiment.

As shown in FIG. 6, in a superconducting cable 1a according to the present modification, preferably, the insulating pipe part 3 has a heat insulating pipe 43 that is stored in the corrugated pipe 21, has a smooth inner peripheral surface, and is made of a heat insulating material. The heat insulating pipe 43 is an inner peripheral surface smoothing member that smooths the inner peripheral surface of the corrugated pipe 21. Further, the superconducting cable core 2 is stored in the heat insulating pipe 43.

Further, the present modification is the same as the embodiment in that the flow passage FP2 through which the coolant flows is formed between the outer peripheral surface of the corrugated pipe 11 and the inner peripheral surface of the corrugated pipe 21. However, the present modification is different from the embodiment in that the flow passage FP2 is formed between the outer peripheral surface of the corrugated pipe 11 and the inner peripheral surface of the heat insulating pipe 43, not between the outer peripheral surface of the heat insulating pipe 43 and the inner peripheral surface of the corrugated pipe 21. The superconducting cable 1a according to the present modification is the same as the superconducting cable 1 according to the embodiment in that the flow passage FP1 through which the coolant for cooling the superconducting cable core 2 flows is formed in the corrugated pipe 11.

Therefore, in the present modification, unlike the embodiment, the coolant after flowing through the flow passage FP1 flows through the flow passage FP2 formed between the outer peripheral surface of the corrugated pipe 11 and the inner peripheral surface of the heat insulating pipe 43, from the end part EP2 (refer to FIG. 5) on the side opposite to the first side in the length direction of the superconducting cable core 2 toward the end part EP1 (refer to FIG. 5) on the first side in the length direction of the superconducting cable core 2, that is, in the direction DR2 shown in FIG. 6.

The superconducting cable 1a according to the present modification is the same as the superconducting cable 1 according to the embodiment in that the coolant before flowing through the flow passage FP2 flows through the flow passage FP1 formed in the heat insulating pipe 23, from the end part EP1 of the superconducting cable core 2 toward the end part EP2 of the superconducting cable core 2, that is, in the direction DR1 shown in FIG. 6.

In this case, when the coolant flows through the flow passage FP2, there is no unevenness on the inner peripheral surface of the heat insulating pipe 43, so that the occurrence of turbulence in the coolant can be prevented or suppressed, and the pressure loss of the coolant flowing through the flow passage FP2 can be reduced. Therefore, even when the coolant is circulated between the long superconducting cable and the cooling device, it is less necessary to increase the pressure for compressing the coolant by the pump as compared with the embodiment, and it is less necessary to increase pressure resistance of each part of the superconducting cable as compared with the embodiment. As a result, the installation cost of the feeder line can be further reduced as compared with the embodiment, and the manufacturing cost of the superconducting cable can be further reduced as compared with the embodiment.

Further, when the heat insulating pipe 43 is made of a heat insulating material, heat exchange between the coolant flowing through the flow passage FP2 as the returning passage and the corrugated pipe 21 is difficult to occur. For this reason, an increase in the temperature of the coolant flowing through the flow passage FP2 as the returning passage can be suppressed as compared with the embodiment, and the efficiency of cooling the superconductor 12 by the coolant flowing through the flow passage FP2 as the returning passage can be improved as compared with the embodiment. Therefore, for example, the temperature at which the coolant discharged from the superconducting cable and returned to the cooling device after flowing through the flow passage FP2 as the returning passage is cooled by the cooling device can be set higher as compared with the embodiment. As a result, the installation cost of the superconducting cable can be further reduced as compared with the embodiment, or the superconducting cable can be more sufficiently cooled as compared with the embodiment.

Preferably, the heat insulating pipe 43 is made of polytetrafluoroethylene or nylon, similarly to the heat insulating pipe 23. That is, preferably, the heat insulating material of the heat insulating pipe 43 is polytetrafluoroethylene or nylon, similarly to the heat insulating material of the heat insulating pipe 23. In this case, similarly to the heat insulating pipe 23 made of polytetrafluoroethylene or nylon, the heat insulating pipe 43 made of polytetrafluoroethylene or nylon has the flexibility and is slidable, and even if thermal contraction due to cooling occurs, the application of stress to the corrugated pipe 21 can be prevented or suppressed by the heat insulating pipe 43.

Preferably, the heat insulating pipe 43 has the flexibility, and the flexibility of the heat insulating pipe 43 is higher than the flexibility of the corrugated pipe 11 and than the flexibility of the corrugated pipe 21. That is, the minimum bending radius of the heat insulating pipe 43 is smaller than the minimum bending radius of the corrugated pipe 11 and than the minimum bending radius of the corrugated pipe 21. As a result, even when the heat insulating pipe 43 is bent with a bending radius substantially equal to the minimum bending radius of the corrugated pipe 11, the bending radius can be prevented from becoming smaller than the minimum bending radius of the heat insulating pipe 43. As a result, even when the heat insulating pipe 43 is bent with a bending radius substantially equal to the minimum bending radius of the corrugated pipe 21, the bending radius can be prevented from becoming smaller than the minimum bending radius of the heat insulating pipe 43.

Preferably, the outer peripheral surface of the heat insulating pipe 43 contacts the inner peripheral surface of each of the plurality of diameter parts 21b included in the corrugated pipe 21. That is, the outer diameter of the heat insulating pipe 43 is substantially equal to the inner diameter ID22 of each of the plurality of diameter parts 21b. As a result, since it is possible to maximize the inner diameter of the heat insulating pipe 43 stored in the corrugated pipe 21, a cross-sectional area of the flow passage FP2 perpendicular to the length direction of the superconducting cable core 2 can be increased, and the pressure loss of the coolant flowing through the flow passage FP2 can be reduced.

Preferably, a state in which the coolant is stored, stays, or does not flow between the outer peripheral surface of the heat insulating pipe 43 and the inner peripheral surface of each of the plurality of diameter parts 21a included in the corrugated pipe 21 is realized. As described above, when the coolant is liquid nitrogen, the thermal conductivity of the non-flowing coolant, that is, liquid nitrogen is small. For this reason, it is possible to prevent or suppress the heat exchange of the coolant flowing through the flow passage FP2 as the returning passage with the storage pipe 22 and the like provided on the outer peripheral side of the corrugated pipe 21 via the corrugated pipe 21. Therefore, even when the superconducting cable is long, it is possible to suppress an increase in the temperature of the coolant flowing through the flow passage FP2 when the coolant flows through the flow passage FP2 as the returning passage, from the end part EP2 (refer to FIG. 5) of the superconducting cable core 2 to the end part EP1 (refer to FIG. 5) of the superconducting cable core 2.

The superconducting cable core 2 may have an inner peripheral surface smoothing member that is stored in the corrugated pipe 21, has a smoothed inner peripheral surface, is made of a heat insulating material, and smooths the inner peripheral surface of the corrugated pipe 21, instead of the heat insulating pipe 43. That is, since it is enough to alleviate the unevenness on the inner peripheral surface of the corrugated pipe 21, the inner peripheral surface smoothing member may not have a tubular shape, and a cross-sectional shape perpendicular to the length direction of the superconducting cable core 2 may have, for example, a C shape or a U shape. Alternatively, a part of the peripheral side surface of the heat insulating pipe 43 is removed and the inner peripheral surface smoothing member may not have a tubular shape.

As a further modification of the superconducting cable according to the embodiment, a superconducting cable may not have the heat insulating pipe 23 but may have only the heat insulating pipe 43. In this case, as compared with the case where the pressure loss of the coolant flowing through the flow passage FP1 as the outgoing passage is directly reduced by the heat insulating pipe 23, the effect of reducing the pressure loss of the coolant flowing through the flow passage FP1 decreases. However, the pressure loss of the coolant flowing through the flow passage FP2 as the returning passage can be reduced by the heat insulating pipe 43. Further, the flow passage FP1 as the outgoing passage and the flow passage FP2 as the returning passage are connected in series. Therefore, by reducing the pressure loss of the coolant flowing through the flow passage FP2 as the returning passage, it is possible to obtain the effect of reducing the pressure loss of the coolant flowing through the flow passage FP1 as the outgoing passage.

Although the invention made by the present inventors has been specifically described on the basis of the embodiments, it goes without saying that the present invention is not limited to the embodiments and various changes can be made without departing from the scope thereof.

It is understood that those skilled in the art can come up with various changes and modifications within the category of the ideas of the present invention, and these changes and modifications also belong to the scope of the present invention.

For example, even if those skilled in the art appropriately adds the components, removes the components, or changes the designs of the components with respect to the above-described embodiments and modifications, or adds steps, omits the steps, or changes conditions of the steps with respect to the above-described embodiments and modifications, it is included in the scope of the present invention as long as it has the gist of the present invention.

INDUSTRIAL APPLICABILITY

The present invention is effectively applied to a superconducting cable.

REFERENCE SIGNS LIST 1, 1a Superconducting cable
2 Superconducting cable core
3 Insulating pipe part
11, 21 Corrugated pipe
11a, 11b, 21a, 21b Diameter part
12 Superconductor
13 Heat insulating layer
14 Superconducting layer
15 Electrically insulating layer
16 Shield superconducting layer
17 Electrically insulating layer
18 Conductor protecting layer
22 Storage pipe
23, 43 Heat insulating pipe
31 Body part
32, 33 End part
34, 35 Power lead
37, 38 Pipe
39 Heat exchanger
41 Circulation pump
CC1 Circulation circuit
DR1, DR2 Direction
EP1, EP2 End part
FP1, FP2 Flow passage
ID11, ID12, ID21, ID22 Inner diameter
SP1 Space

The invention claimed is:

1. A superconducting cable comprising a superconducting cable core and a storage pipe part storing the superconducting cable core, wherein
the superconducting cable core includes
a first corrugated pipe,
a superconductor provided on the outer peripheral side of the first corrugated pipe, and
a first heat insulating pipe that is stored in the first corrugated pipe, has a smooth inner peripheral surface, and is made of a first heat insulating material,
a first flow passage through which a coolant for cooling the superconducting cable core flows is formed in the first heat insulating pipe,
a second flow passage through which the coolant flows is formed between an outer peripheral surface of the first corrugated pipe and an inner peripheral surface of the storage pipe part,
the coolant flows through the first flow passage from the first side toward the side opposite to the first side in a length direction of the superconducting cable core, and
the coolant after flowing through the first flow passage flows through the second flow passage from the side opposite to the first side toward the first side in the length direction of the superconducting cable core, wherein
the first corrugated pipe includes
a plurality of first diameter parts arranged along the length direction of the superconducting cable core and each having a first inner diameter, and
a plurality of second diameter parts arranged along the length direction of the superconducting cable core and each having a second inner diameter smaller than the first inner diameter,
the plurality of first diameter parts and the plurality of second diameter parts are disposed alternately one by one along the length direction of the superconducting cable core, and
an outer peripheral surface of the first heat insulating pipe contacts an inner peripheral surface of each of the plurality of second diameter parts.

2. The superconducting cable according to claim 1, wherein
the flexibility of the first heat insulating pipe is higher than the flexibility of the first corrugated pipe.

3. The superconducting cable according to claim 1, wherein
a state in which the coolant is stored, stays, or does not flow between the outer peripheral surface of the first heat insulating pipe and an inner peripheral surface of each of the plurality of first diameter parts is realized.

4. The superconducting cable according to claim 1, wherein
the first corrugated pipe is made of stainless steel, and
the first heat insulating material is polytetrafluoroethylene.

5. The superconducting cable according to claim 1, wherein
the storage pipe part includes
a second corrugated pipe and
a second heat insulating pipe that is stored in the second corrugated pipe, has a smooth inner peripheral surface, and is made of a second heat insulating material,
the superconducting cable core is stored in the second heat insulating pipe, and
the second flow passage is formed between an outer peripheral surface of the first corrugated pipe and an inner peripheral surface of the second heat insulating pipe.

6. The superconducting cable according to claim 5, wherein
the flexibility of the second heat insulating pipe is higher than the flexibility of the first corrugated pipe and than the flexibility of the second corrugated pipe.

7. The superconducting cable according to claim 5, wherein
the second corrugated pipe includes
a plurality of third diameter parts arranged along the length direction of the superconducting cable core and each having a third inner diameter, and
a plurality of fourth diameter parts arranged along the length direction of the superconducting cable core and each having a fourth inner diameter smaller than the third inner diameter, the plurality of third diameter parts and the plurality of fourth diameter parts are disposed alternately one by one along the length direction of the superconducting cable core, and an outer peripheral surface of the second heat insulating pipe contacts an inner peripheral surface of each of the plurality of fourth diameter parts.

8. The superconducting cable according to claim 7, wherein
a state in which the coolant is stored, stays, or does not flow between the outer peripheral surface of the second heat insulating pipe and an inner peripheral surface of each of the plurality of third diameter parts is realized.

9. The superconducting cable according to claim 5, wherein
the second corrugated pipe is made of stainless steel, and the second heat insulating material is polytetrafluoroethylene.

10. The superconducting cable according to claim 5, wherein
the storage pipe part is an insulating pipe part that thermally insulates the stored superconducting cable core from the outside,
the insulating pipe part includes a storage pipe that stores the second corrugated pipe, and
a space between an outer peripheral surface of the second corrugated pipe and an inner peripheral surface of the storage pipe is evacuated.

11. The superconducting cable according to claim 1, wherein
the superconducting cable core includes a heat insulating layer that covers the outer peripheral surface of the first corrugated pipe and is made of a third heat insulating material, and
the superconductor is provided on the outer peripheral side of the heat insulating layer.

12. The superconducting cable according to claim 11, wherein
the superconductor includes
a first superconducting layer provided on the outer peripheral side of the heat insulating layer,
an electrically insulating layer covering the first superconducting layer, and
a second superconducting layer provided on the outer peripheral side of the electrically insulating layer.

13. A superconducting cable comprising a superconducting cable core and a storage pipe part storing the superconducting cable core, wherein
the superconducting cable core includes
a first corrugated pipe,
a superconductor provided on the outer peripheral side of the first corrugated pipe, and
a first heat insulating pipe that is stored in the first corrugated pipe, has a smooth inner peripheral surface, and is made of a first heat insulating material,
a first flow passage through which a coolant for cooling the superconducting cable core flows is formed in the first heat insulating pipe,
a second flow passage through which the coolant flows is formed between an outer peripheral surface of the first corrugated pipe and an inner peripheral surface of the storage pipe part,
the coolant flows through the first flow passage from the first side toward the side opposite to the first side in a length direction of the superconducting cable core, and
the coolant after flowing through the first flow passage flows through the second flow passage from the side opposite to the first side toward the first side in the length direction of the superconducting cable core, wherein
the storage pipe part includes
a second corrugated pipe and
a second heat insulating pipe that is stored in the second corrugated pipe, has a smooth inner peripheral surface, and is made of a second heat insulating material,
the superconducting cable core is stored in the second heat insulating pipe,
the second flow passage is formed between an outer peripheral surface of the first corrugated pipe and an inner peripheral surface of the second heat insulating pipe,
the second corrugated pipe includes
a plurality of third diameter parts arranged along the length direction of the superconducting cable core and each having a third inner diameter, and
a plurality of fourth diameter parts arranged along the length direction of the superconducting cable core and each having a fourth inner diameter smaller than the third inner diameter,
the plurality of third diameter parts and the plurality of fourth diameter parts are disposed alternately one by one along the length direction of the superconducting cable core, and
an outer peripheral surface of the second heat insulating pipe contacts an inner peripheral surface of each of the plurality of fourth diameter parts.

14. The superconducting cable according to claim 13, wherein
a state in which the coolant is stored, stays, or does not flow between the outer peripheral surface of the second heat insulating pipe and an inner peripheral surface of each of the plurality of third diameter parts is realized.

15. A superconducting cable comprising a superconducting cable core and a storage pipe part storing the superconducting cable core, wherein
the superconducting cable core includes
a first corrugated pipe,
a superconductor provided on the outer peripheral side of the first corrugated pipe, and
a first heat insulating pipe that is stored in the first corrugated pipe, has a smooth inner peripheral surface, and is made of a first heat insulating material,
a first flow passage through which a coolant for cooling the superconducting cable core flows is formed in the first heat insulating pipe,
a second flow passage through which the coolant flows is formed between an outer peripheral surface of the first corrugated pipe and an inner peripheral surface of the storage pipe part,
the coolant flows through the first flow passage from the first side toward the side opposite to the first side in a length direction of the superconducting cable core, and
the coolant after flowing through the first flow passage flows through the second flow passage from the side opposite to the first side toward the first side in the length direction of the superconducting cable core, wherein
one portion of an outer peripheral surface of the first heat insulating pipe, and a portion on a side opposite to the one portion in a radial direction of the outer peripheral surface of the first heat insulating pipe, both contact an inner peripheral surface of the first corrugated pipe.

* * * * *